United States Patent
Vach et al.

(10) Patent No.: US 12,534,796 B2
(45) Date of Patent: Jan. 27, 2026

(54) PROCESS FOR PRODUCING NANOCLUSTERS OF SILICON AND/OR GERMANIUM EXHIBITING A PERMANENT MAGNETIC AND/OR ELECTRIC DIPOLE MOMENT

(71) Applicants: CENTRE NATIONAL DE LA RECHERCHE SCIENTIFIQUE, Paris (FR); ECOLE POLYTECHNIQUE, Palaiseau (FR); UNIVERSITE D'ORLEANS, Orleans (FR)

(72) Inventors: Holger Vach, Coignieres (FR); Fatme Jardali, Palaiseau (FR); Yvan Bonnassieux, Paris (FR); Laïfa Boufendi, Saint Denis en Val (FR)

(73) Assignees: CENTRE NATIONAL DE LA RECHERCHE SCIENTIFIQUE, Paris (FR); ECOLE POLYTECHNIQUE, Palaiseau (FR); UNIVERSITE D'ORLEANS, Orleans (FR)

( * ) Notice: Subject to any disclaimer, the term of this patent is extended or adjusted under 35 U.S.C. 154(b) by 483 days.

(21) Appl. No.: 17/756,758

(22) PCT Filed: Dec. 4, 2020

(86) PCT No.: PCT/EP2020/084712
§ 371 (c)(1),
(2) Date: Jun. 1, 2022

(87) PCT Pub. No.: WO2021/110956
PCT Pub. Date: Jun. 10, 2021

(65) Prior Publication Data
US 2023/0009716 A1    Jan. 12, 2023

(30) Foreign Application Priority Data

Dec. 6, 2019 (FR) ........................... 1913888

(51) Int. Cl.
*C23C 16/24* (2006.01)
*A61K 9/14* (2006.01)
(Continued)

(52) U.S. Cl.
CPC ............... *C23C 16/24* (2013.01); *A61K 9/14* (2013.01); *B01J 21/06* (2013.01); *B01J 23/14* (2013.01);
(Continued)

(58) Field of Classification Search
CPC ....... C23C 16/24; C23C 16/515; C01B 33/03; H01L 21/02532; H01L 21/02603;
(Continued)

(56) References Cited

U.S. PATENT DOCUMENTS 8,723,216 B2    5/2014  Pschenitzka
9,601,579 B2    3/2017  Zhang
(Continued)

FOREIGN PATENT DOCUMENTS

FR    2937055 A1    4/2010
FR    3078345 A1    8/2019
(Continued)

OTHER PUBLICATIONS

Machine translation of JP-2002029728-A, Tanigaki K. (Year: 2002).*
(Continued)

*Primary Examiner* — Mayla Gonzalez Ramos
(74) *Attorney, Agent, or Firm* — Greer, Burns & Crain, Ltd (57) ABSTRACT

A process for producing nanoclusters of silicon and/or germanium exhibiting a permanent magnetic and/or electric dipole moment for adjusting the work function of materials, for micro- and nano-electronics, for telecommunications, for (Continued)

"nano-ovens", for organic electronics, for photoelectric devices, for catalytic reactions and for fractionation of water.

18 Claims, 2 Drawing Sheets

(51) Int. Cl.

| | |
|---|---|
| *B01J 21/06* | (2006.01) |
| *B01J 23/14* | (2006.01) |
| *B01J 35/33* | (2024.01) |
| *B01J 37/02* | (2006.01) |
| *C01B 33/03* | (2006.01) |
| *C23C 16/515* | (2006.01) |
| *H01F 41/30* | (2006.01) |
| *H01J 37/32* | (2006.01) |
| *H01L 21/02* | (2006.01) |

(52) U.S. Cl.
CPC .......... *B01J 35/33* (2024.01); *B01J 37/0215* (2013.01); *C01B 33/03* (2013.01); *C23C 16/515* (2013.01); *H01F 41/30* (2013.01); *H01J 37/32697* (2013.01); *H01L 21/02532* (2013.01); *H01L 21/0259* (2013.01); *H01L 21/0262* (2013.01); *C01P 2004/64* (2013.01); *C01P 2006/40* (2013.01); *C01P 2006/42* (2013.01); *H01J 2237/332* (2013.01)

(58) Field of Classification Search
CPC .. H01L 21/0262; H01L 21/0259; B01J 35/23; B01J 35/33; B01J 21/06; B01J 23/14; B01J 37/0215; A61K 9/14; H01F 41/30; H01J 37/32697; H01J 2237/332; C01P 2004/64; C01P 2006/40; C01P 2006/42
See application file for complete search history.

(56) References Cited

U.S. PATENT DOCUMENTS

| | | | | |
|---|---|---|---|---|
| 2002/0130311 | A1* | 9/2002 | Lieber | H01L 29/26 257/E29.081 |
| 2004/0214416 | A1 | 10/2004 | Woo et al. | |
| 2011/0042642 | A1* | 2/2011 | Alet | C30B 29/36 977/762 |
| 2011/0272742 | A1 | 11/2011 | Akiyama et al. | |
| 2015/0072446 | A1 | 3/2015 | Worfolk et al. | |

FOREIGN PATENT DOCUMENTS

| | | | |
|---|---|---|---|
| JP | 2002029728 A | * | 1/2002 |
| WO | 0114250 A2 | | 3/2001 |
| WO | 2009122113 A2 | | 10/2009 |
| WO | 2011046314 A2 | | 4/2011 |
| WO | 2011086316 A2 | | 7/2011 |
| WO | 2011086317 A1 | | 7/2011 |

OTHER PUBLICATIONS

S. C. Bodepudi A. P. Singh S. Pramanik, Giant Current-Perpendicular-to-Plane Magnetoresistance in Multilayer Graphene as Grown on Nickel, Nano Lett. 2014, 14, 5, 2233-2241. (Year: 2014).*
French Search Report received for Application No. 1913888, dated Oct. 27, 2020.
International Search Report and Written Opinion received for PCT/EP2020/084712, mailed Mar. 9, 2021.
Back, T., et al., "Work function characterization of directionally solidified LaB6—VB2 eutectic," Ultramicroscopy, 183, Dec. 2017, pp. 1-5.
Bolotov, L., et al., "Scanning-tunneling-microscope-assisted assembling of hydrogen-saturated silicon clusters on Si(111)-(7X7) surfaces," Applied Physics Letters, vol. 78, No. 23, 2001, pp. 3720-3722.
Forero-Martinez, N., et al., "Self-Assembly in Silane/Hydrogen Plasmas: from Silicon Atoms to Aromatic Silicon Nanocrystals," Plasma Chem Plasma Process 34, 2014, pp. 535-543.
Kazimierski P, et al., "Transition from amorphous semiconductor to amorphous insulator in hydrogenated carbon-germanium films investigated by IR spectroscopy," Journal of Non-Crystalline Solids 355, 2009, pp. 280-286.
Lemes, M., et al., "Generalized simulated annealing: Application to silicon clusters," Physical Review B, vol. 56, No. 15, 1997, pp. 9279-9281.
Lin, Z., et al., "DNA Attachment and Hybridization at the Silicon (100) Surface," Langmuir 18, 2002, pp. 788-796.
Marsen B., et al., "The energy gap of pristine silicon clusters," Journal of Electron Spectroscopy and Related Phenomena 109, 2000, pp. 157-168.
Qin, W., et al., "Controllable synthesis of silicon nano-particles using a one-step PECVD-ionic liquid strategy", J. Mater. Chem. A, 2015, pp. 10233-10237.
Ray, S., et al., "Nanocrystals for silicon-based light-emitting and memory devices," J. Phys D: Appl. Phys 46, 2013, 31 pages.
Rusu, P., et al., "Surface Dipoles and Work Functions of Alkylthiolates and Fluorinated Alkylthiolates on Au(111)", J. Phys. Chem. B , vol. 110, No. 45, 2006, pp. 22628-22634.
Vach, H., et al., "Controlled Growth of Silicon Nanocrystals in a Plasma Reactor," Physical Review Letters 95, 2005, pp. 165502-1 to 165502-4.
Vach, H., "Ultrastable Silicon Nanocrystals due to Electron Delocalization," Nano Lett. 11, 2011, pp. 5477-5481.
Vach, H., "Electron-Deficiency Aromaticity in Silicon Nanoclusters," Journal of Chemical Theory and Computation 8, 2012, pp. 2088-2094.
Bolotov, L., et al., "ERRATUM: Scanning-tunneling-microscope-assisted assembling of hydrogen-saturated silicon clusters on Si(111)-(7X7) surfaces," Applied Physics Letters, vol. 85, No. 23, Dec. 6, 2004, pp. 5791.

* cited by examiner

PROCESS FOR PRODUCING NANOCLUSTERS OF SILICON AND/OR GERMANIUM EXHIBITING A PERMANENT MAGNETIC AND/OR ELECTRIC DIPOLE MOMENT

BACKGROUND

The present invention relates to a process for producing nanoclusters of silicon and/or germanium.

The invention finds a beneficial application in the field of thermionic emission and of thermoelectric devices by virtue of the proposed adjustment to the work function of a material, and can be applied equally well to the fields of micro- and nanoelectronics, in particular as regards new all-silicon memories because of the magnetic properties of these nanostructures; telecommunications based on terahertz devices; nano-furnaces for annealing the devices, or for the treatment of cancer or other diseases such as Alzheimer's disease; organic electronics; photoelectric devices; catalytic reactions and fractionation of water.

The work function of a given material is the minimum thermodynamic work, i.e. the energy necessary to extract an electron from this material to a point situated in the vacuum immediately outside the surface of this material. Often, the choice of a material is dictated by the target application. For example, in some cases, a material with a very low work function can be advantageous for electron emission in particular, while in other cases, a material with a high work function is preferable, in particular for the injection and extraction of electrons in organic electronic devices. The purpose of the present invention is to modify the work function of a given material in order to approach the optimum value for a chosen application.

In the state of the prior art, "Work function characterization of directionally solidified $LaB_6$—$VB_2$ eutectic." C. Back et al., Ultramicroscopy, 183, December 2017, pages 67-71, in order to improve the mechanical stability for example and reduce even further the work function of the single-crystal $LaB_6$ (lanthanum hexaboride) materials, directionally solidified eutectics comprising an $LaB_6$ matrix phase with a transition metal diboride phase forming fibres in a homogenous fashion throughout the matrix have recently been proposed. The transition metals typically envisaged are Zr, Hf, Ti and V. However, the utilization of transition metals such as vanadium has several drawbacks, in particular its scarcity, the resulting high costs, and moreover its high toxicity. Another solution "Surface Dipoles and Work Functions of Alkylthiolates and Fluorinated Alkylthiolates on Au(111)", PC Rusu et al., J. Phys. Chem. B 2006, 110, 45, pp 22628-22634, consists of coating a material with self-assembled monolayers (SAM) of organic molecules capable of increasing or reducing the work function as a function of the specific composition of these molecules. The utilization of organic SAMs can be a reasonable solution at relatively low temperatures, but certainly cannot withstand high temperatures (approximately 800° C.) as required for example by thrusters.

Document U.S. Pat. No. 8,723,216 B2 is known, describing a process for modifying the work function of a conductive film based on a metal nanostructure by applying a layer of metal nanostructures. The dipole ligands disclosed are relatively fragile and cannot withstand high-temperature applications.

Document US 2015/0072446 A1 is also known, describing a process limited to the modification of the work function of the organic devices by utilizing only functionalized polymer semiconductors and/or a restricted list of small molecules. The polymers and the small molecules listed are not stable at a high temperature.

Document US 2004/0214416 A1 describes a process for producing a semi-conductive structure having a gate the work function of which is controlled. The process described is limited to a single application in electronics and does not allow a protective coating to be obtained.

Document WO2001/014250 A2 describes a process for producing particles comprising silicon. There is no proposal for modifying the work function of a material.

Documents WO2011/086317 A1 and WO2011/086316 A2 are also known, relating respectively to the optoelectronic and vibratory properties of silicon nanowires. A technique for electrically connecting silicon nanowires with nano-objects is taught in particular in the document WO2011/086314 A1. These documents relate only to a specific, symmetrical theoretical form of nanotubes.

The aim of the present invention is a new type of nanoclusters as well as a process for producing these nanoclusters.

Another aim of the present invention is the design of a material having a modified work function adapted for applications at high and low temperatures. A further aim of the invention is a fine adjustment of the work function of a material.

Yet a further aim of the invention is the application of a non-toxic and protective thin layer.

SUMMARY

At least one of the aforementioned aims is achieved with a process for producing nanoclusters of silicon and/or germanium exhibiting a permanent magnetic and/or electric dipole moment by means of a capacitive- or inductive-coupling plasma reactor by implementing a pulsed plasma-enhanced chemical vapour deposition (PECVD), chemical vapour deposition (CVD), microwave plasma chemical vapour deposition, cathodic arc or magnetron sputtering, atmospheric pressure microplasma deposition, dielectric barrier discharge (DBD), pyrolysis or laser ablation process; the process being carried out with the following parameters:
- a pressure comprised between 0.01 mbar and atmospheric pressure, or between 0.05 mbar and 5 mbar, or ideally 0.1 mbar,
- a direct-current voltage, radiofrequency or microwave discharge at 13.56 MHz or 2.45 GHz or their harmonics,
- a driving power comprised between 0.01 mW/cm$^3$ and 20 mW/cm$^3$, ideally between 0.1 mW/cm$^3$ and 5 mW/cm$^3$,
- a gas temperature between ambient temperature and 350° C., or between 50° C. and 150° C., ideally at 120° C.,
- a time period between the start of generation and the end of generation of a plasma in the reactor comprised between 0.01 second and 20 seconds, or between 0.1 second and 10 seconds, ideally 2 seconds,
- the nanoclusters are deposited under the effect of a DC electrical voltage comprised between 0 V and 1,000 V, preferably approximately 200 V.

The terms "nanocluster" and "non-tetrahedral nanostructure" will be used interchangeably hereinafter.

With such a reactor, it is possible to control the thermodynamic conditions precisely so as to obtain nanostructures with the desired dimensions and a deposited layer corresponding to the desired work function modification of a given material.

At least one of the aforementioned aims is achieved with a process for adjusting the work function of a material, this process comprising a step of depositing non-tetrahedral nanostructures of silicon and/or germanium on the material. In other words, the process according to the invention can comprise depositing nanoclusters on a material; parameters being defined so as to adjust the work function of this material.

The general family of these nanostructures, with a structure that is either symmetrical, or irregular, was first proposed theoretically in 2005 (Phys. Rev. Lett. 95, 165502 [2005]). A more detailed theoretical analysis of a highly symmetrical nanostructure model of this family was published in 2011, explaining its exceptional stability (Nano Lett. 11, 5477-5481 [2011], J. Chem. Theory Comput. 8, 2088-2094 [2012]).

The present invention goes beyond a nanostructure discovery as it implements the production of nanoclusters of silicon and/or germanium exhibiting a permanent magnetic and/or electric dipole moment, as well as a particularly innovative utilization of these nanoclusters to modify the work function of a material. Another purpose of the invention is a material on which nanoclusters have been deposited.

With the process according to the invention, it is possible to deposit non-tetrahedral nanostructures of silicon and/or germanium in scattered fashion or in the form of a layer that in particular constitutes a protection, and that through the presence of the specific nanostructures, modifies the work function of the material.

By non-tetrahedral nanostructure of silicon and/or germanium is meant an assembly of silicon and/or germanium atoms that forms spontaneously by self-assembly under suitable conditions. This nanostructure does not have any tetrahedral structure and can be very symmetrical or completely asymmetrical. It can be either completely or partially hydrogenated, or not at all. It always has at least one silicon (Si) or germanium (Ge) atom with an excess coordination number provided that the correct ratio between atomic and molecular hydrogen is respected during synthesis. On account of this excess coordination number, the nanostructures have bonds that are deficient in electrons, which causes a delocalization of the electrons between the Si or Ge atom and its neighbours, producing bonding energies considerably greater than those of the known tetrahedral structures where the electrons can be considered as localized between the Si or Ge atoms. On account of the excess coordination number and the very delocalized nature of the electrons, non-tetrahedral nanostructures have specific properties, such as an annular current induced by an extremely high magnetic field of approximately 42.0 nAT$^{-1}$ while the corresponding value for the benzene molecule is only 12.9 nAT$^{-1}$. Furthermore, theoretical studies have shown that the internal non-centred Si or Ge atom bears a permanent charge conferring on the nanostructure a strong permanent electric dipole moment and an optical absorption extending from ultraviolet in the visible to the infra-red and terahertz region of the spectrum.

The process according to the invention makes it possible to modify the work function of a material in an easy, effective and economical fashion. This process can be simply incorporated into a production line of the silicon-based devices.

The invention is noteworthy in particular because it comprises the original choice of a nanostructure based on a form of silicon or germanium, or even a mixture of the two, that is allotropic, natural and non-toxic. Its low cost and its small size means that it is useful for numerous applications of nanometric systems. The deposited layer according to the invention acts both to modify the work function and also as a protective layer against chemical degradation (oxidation), for stabilization of volatile materials and for encapsulation.

The material can advantageously be lanthanum hexaboride (LaB$_6$), a tungsten substrate, any other metal or any other material such as for example a semi-metal, a semiconductor, a refractory ceramic material, other ceramics or alloys such as for example tin-doped indium oxide ITO.

The parameters according to the invention constitute the thermodynamic conditions utilized in particular during a plasma-assisted chemical vapour deposition in order to allow the generation of non-tetrahedral nanostructures of silicon and/or germanium, to avoid their transformation into other nanostructures, and to allow their deposition in a thin layer on the material.

The best results have been obtained for nanoclusters having a size less than or equal to 4 nm and ideally 1 nm.

It has been shown that with a size of the order of one nanometre, these nanostructures have a permanent dipole moment comprised between 2.0 and 2.5 Debye, i.e. between $6.67 \times 10^{-30}$ C. m and $8.34 \times 10^{-30}$ C m.

According to an advantageous embodiment of the invention, the plasma can be generated during a time period that is a function of the desired level of adjustment of the work function of the material. The time period during which the plasma is generated constitutes a adjustment parameter of the desired value of the work function.

In particular in addition to the foregoing, the invention can comprise a step of production of the nanoclusters of silicon and/or germanium starting from a gaseous mixture based on silane (SiH$_4$) and/or germane (GeH$_4$), mixed with argon (0-20%) or other rare gas and/or hydrogen (0-10%). It is also possible to utilize a gaseous mixture based on tetrafluorosilane.

Preferably, the nanoclusters are deposited on a material in at least one homogenous layer, i.e. the deposition is carried out on a zone of the material such that the non-tetrahedral nanostructures of silicon and/or germanium completely cover the material in this zone.

For example, the thickness of the layer can correspond to a desired work function.

The strong dipole moments mean that the nanoclusters can naturally stack on top of one another. In this way, they can form ultrafine silicon nanowires. Alternatively, it is also possible to leave a part of the surface of the material uncovered.

According to a preferred embodiment, the process according to the invention can comprise the steps of:
generating a plasma,
stopping the plasma at the end of a predetermined time period, allowing the creation and preservation of the nanoclusters of silicon and/or germanium exhibiting a permanent magnetic and/or electric dipole moment, having for example a size of less than 4 nm, ideally less than or equal to 1 nm,
adjusting the work function of the material to be treated by applying at least one direct-current voltage so as to modify the orientation of the non-tetrahedral nanostructures of silicon and/or germanium being deposited on the material.

The direct-current voltage can be applied, for example, between the two same electrodes as those utilized during the generation of the plasma.

Once the generation of the plasma is interrupted, the nanoclusters created are mainly distributed equally in a region situated below the upper electrode. Thus, in the absence of any applied direct-current voltage, the nanostructures reach the material while preserving their initial random distribution overall. However, in the presence of a voltage applied between the electrodes, owing to their dipolar moments the nanostructures adopt a new orientation that allows them to be deposited on the substrate with this well-defined orientation.

With the process according to the invention, it is possible to continuously adjust the work function of the material.

According to an advantageous embodiment of the invention, the adjustment can consist of:
applying a direct-current voltage, ideally after switching off the plasma, and
varying this direct-current voltage in space or time, so as to obtain a variation of the work function along the material.

According to an advantageous embodiment, the process according to the invention can comprise a step of varying at least one of these two voltages in space or time, so as to obtain a variation of the work function along the material.

Such an embodiment makes it possible in particular to deposit a layer of nanostructures with different orientations and/or thicknesses along the surface of a material, in particular creating gradients.

According to another advantageous embodiment of the invention, the adjustment can consist of applying in the reactor, ideally after switching off the plasma, at least two direct-current voltages the directions of which are orthogonal.

It is possible to produce several layers with densities, thicknesses and orientations of the nanostructures that are different as a function of the layers and as a function of the zone on the surface of the material.

Such a production makes it possible to envisage numerous combinations utilizing voltages so as to determine the work function modification value with precision, as well as to have variable work function levels along the surface of the material.

A substrate material that is fixed or mobile during deposition can be envisaged.

According to the invention, the electric field oriented vertically and the specific conditions of the deposition promote stacking of the nanoclusters during their surface deposition, leading to the progressive variation of the work function of the substrate material.

With the process according to the invention, it is possible to modify a work function by a value between +1.25 eV and −1.25 eV, or between +1.5 eV and −1.5 eV by adjusting the parameters of the plasma and the vertical and horizontal direct-current voltages applied during deposition. Such a possibility of continuous adjustment of the work function can advantageously be applied, for example, in the field of organic electronics, in order to produce conditions of perfect matching between metal electrodes and organic semiconductors such as pentacene.

The work function is thus adjusted by means of one or more direct-current voltages applied during the deposition and also by means of the parameters of the reactor which make it possible in particular to define the size and the dipole moment of the nanostructures.

By way of non-limitative example, the time period between stopping the generation of the plasma and application of a direct-current voltage is comprised between 1 ms and 2,000 ms, or between 20 and 1,000 ms, ideally 50 ms.

According to an advantageous embodiment, the process according to the invention can comprise the creation of several individual layers of non-tetrahedral nanostructures of silicon and/or germanium by generating plasma in a pulsed fashion. For example, each pulse makes it possible to increase either the surface coating of the material to be treated, or the thickness of the layer.

In other words, the nanostructures can be synthesized between electrodes by means of a capacitive radiofrequency discharge of a gaseous mixture based on silane and/or germane. As soon as the plasma on-time begins, dissociation of the molecules of $SiH_4$ leads to the formation of $SiH_3$, identified as the main core starting from which the formation of the silicon nanoparticles begins in low-pressure non-thermal plasmas. The electrical properties of the plasma and of the discharge are determined according to the invention to avoid the agglomeration phase in order to deposit only individual nanostructures on the surface of the material. To this end, the plasma is pulsed by adjusting the start and the end of the plasma. Preferably, the time period between two pulses is greater than or equal to the time required to empty the reactor. This time period depends in particular on the reactor (type, size, etc.) and the physical parameters defined during the deposition (temperature, pressure, gases utilized, etc.). By way of non-limitative example, it was possible to utilize a time period greater than or equal to 3.5 seconds.

According to the invention, the deposition step can comprise a first phase of deposition of the nanoclusters of silicon and/or germanium on a transporter element comprising a sol-gel, a liquid, or a sol-gel liquid matrix; and a second phase of deposition on said material.

In this embodiment, a liquid is utilized as a vector. To this end, non-tetrahedral nanostructures of silicon and/or germanium are created, they are deposited in the liquid, the latter then being placed in a recipient that is sent to a site of utilization. The liquid can then be placed on the material to be treated, with a view to utilization as a coating by means of centrifugation ("spin-coating") or with a view to utilization as printing ink, for example for printing electronic circuits. Removal of the liquid can be carried out in particular by evaporation. During deposition of the non-tetrahedral nanostructures of silicon and/or germanium on the material, direct-current voltages can be applied as defined above.

According to the invention, a process is provided in which the deposition can be carried out on a metal or a metal oxide forming cathodes or electrodes in a thermionic device, a thermoelectric device or an electron emission device. In addition to modifying the work function of such a device, it is possible to apply an alternating current, during utilization of the device, so as to oscillate the dipole moments of the non-tetrahedral nanoclusters of silicon and/or germanium; these oscillations causing heating of the device and therefore variation of the characteristics of the device.

The present invention can thus relate to the field of exploration in deep space. It is known that ionic and plasma thrusters, as well as the other electric propulsion appliances in general, operate more efficiently than the chemical propulsion devices. While the ion thrusters supply a weak thrust, they do this with a high specific impulse, which means that they significantly modify the impulse per unit weight of the thruster. In a Hall-effect engine (Hall thruster [HT]), for example, a discharge is switched on in a configuration of crossed magnetic and electric fields inside an annular ceramic channel. A device supplying electrons, the role of which is to feed the discharge channel with electrons capable of generating and maintaining the plasma and also neutralizing the ion beam ejected from the channel, must be utilized. Tungsten filaments (utilized in the 1960s in the context of gridded ion thrusters) are not suitable for actual missions, since very high power must be used in order to reach a sufficiently high filament temperature to extract the required electron current density.

To overcome this difficulty, the plasma-based thrusters intended for deep-space voyages comprise cathodes that have been manufactured with $LaB_6$ materials, which are relatively volatile on account of their intrinsically very low work function, which leads to relatively efficient electron ejection. In order to further increase the mechanical stability and further reduce the work function of the single-crystal $LaB_6$ materials, a treatment with transition metal diborides has recently been proposed. The typical transition metals are Zr, Hf, Ti and V. Utilization of these transition metals such as vanadium has several drawbacks, in particular its scarcity, its high cost, and furthermore its high toxicity. Another solution consists of coating a material with self-assembled monolayers (SAM) of organic molecules capable of reducing the work function. However, the organic SAMs can certainly not withstand the high temperatures (approximately 800° C.) required by thrusters.

A specific application of the present invention consists of functionalizing the cathodes by depositing on the surface of these cathodes non-tetrahedral nanoclusters of silicon and/or germanium, which are cheap, chemically stable and non-toxic, in order to obtain stable cathodes with the lowest possible work function. This functionalization can be produced on existing thruster cathode materials (such as $LaB_6$ or even $LaB_6$ treated with transition metal diborides) in order to further reduce their work function and to simultaneously fix and encapsulate the toxic and volatile materials. After functionalization, the thruster cathodes efficiently deliver a sufficient number of electrons in order to, for example, neutralize the thruster ion beams, while ensuring that the spacecraft does not become dangerously charged, which could for example cause failure of its electronic and communication devices. With the invention, the necessary emission of electrons will take place at a temperature that is considerably reduced with respect to the non-functionalized cathodes, which will increase the lifetime of the cathodes, reduce the electrical power required and result in a reduction in the weight of the thrusters on account of the reduced requirement for cooling circuits.

The present invention also finds an important application in the field of energy management; for example, in the field of thermonuclear fusion; for example, in the production of neutral atom beams in the Tokamak ITER reactor. The basic principle of the most powerful ITER heating system is relatively simple: rapid hydrogen or deuterium atoms (>10,000 km/s) are injected into the plasma via the magnetic field cage of the Tokamac, where they transfer their energy to the plasma particles by collision. To this end, neutral atom beams are created by accelerating the high-energy ions by means of electrical fields, then neutralizing them by adding or removing an electron on the fly. Hydrogen ions are generated in the plasma sources, accelerated towards a first electrode, then enter a region with a high electric field where they acquire their final speed. The challenge for the ITER sources is that the required energy of the beam (1 MeV) imposes the utilization of negative ions, which have a better neutralization yield than the positive ions used in the neutral beam injection systems of most of the other fusion installations. One of the current limitations encountered in ITER installations relates to the excessively high energy consumption.

Exactly as for the thruster applications, the objective is to utilize cathodes with the lowest possible work function. Currently, costly and toxic materials with high energy consumption are utilized for this type of cathodes. Functionalization with the nanoclusters of the present invention can be carried out either on cheap cathodes that are chemically stable and non-toxic, or on cathodes already utilized in order to obtain the electron stream required for the formation of the negative ions. Owing to the resulting reduced work function and the capacity for encapsulation with the layer of nanoclusters proposed, the necessary negatively charged ion beams will be generated with a considerably reduced energy consumption, with durable and environmentally-friendly cathodes.

Other applications of the present invention include, of course, all kinds of applications based on electron emitters (electron guns) where it is beneficial to create electron beams. The reduction in the work function of the electrodes involved, resulting from the functionalization with the non-tetrahedral nanoclusters of the present invention, gives electrodes with a longer lifetime, lower energy consumption, more easily-controllable electron injection and possibly cheaper production costs (if a cheaper electrode material is utilized). These applications include, non-limitatively, ultra high-frequency linear beam vacuum tubes such as klystrons, inductive output tubes, progressive wave tubes and gyrotrons, scientific instruments such as electron microscopes and particle accelerators, mass spectrometers for dissociating and ionizing vaporized or gaseous particles, powerful electron beam guns for welding, metal coating, metal 3D printers, metal powder production, vacuum furnaces or even the production of X-rays.

According to a characteristic of the invention, the deposition can be carried out on a catalytic material intended to be utilized as catalyst during a chemical reaction.

In chemistry, a catalyst is a substance that causes a chemical reaction that is different to what it would have been in the absence of a catalyst. For example, a catalyst can cause a reaction that is faster or at a lower temperature than in the absence of a catalyst. It is estimated that 90% of all commercially produced chemical products utilize catalysts at one stage or another of their production process. In 2005, catalytic processes generated approximately 900 billion dollars in products worldwide.

An advantageous application of the present invention is the controlled deposition of non-tetrahedral nanoclusters of silicon and/or germanium on catalytic materials, as it is known that the speeds of reactions catalysed by a metal depend exponentially on the work function of the catalyst. Consequently, even minor modifications in the work function of the catalyst lead to significant modifications in the rate of catalytic reactions. The most lucrative markets are those of the automobile and chemical industries A particular case is the application of the present invention to the process of fractionation (or electrolysis) of water. The fractionation of water is the chemical reaction in which water is decomposed into oxygen and hydrogen: $2H_2O \rightarrow 2H_2+O_2$. Photochemical fractionation of water, which is efficient and economical, constitutes a technological advance capable of supporting energy transition. Therefore, the design of efficient photoelectrodes is of the greatest importance. At present, the noble metals with high work function (such as platinum [Pt] or metals of the Pt group) are mainly utilized because they have demonstrated the best catalytic activities for producing hydrogen to date. In order to overcome the costs limitation for large-scale production, there has been great interest in research into replacement materials that are efficient and abundant on Earth, such as metals that are less costly and have a very high work function. Within the framework of the present invention, even higher rates of hydrogen production can be achieved by functionalizing the currently used platinum-based photoelectrodes with non-tetrahedral nanoclusters of the present invention in order to use electrodes with an even higher work function and/or less costly metals functionalized to have a work function at least as high as that of the platinum (Pt) or platinum group metals.

The present invention can be used for the design of devices in organic electronics or of photoelectric devices.

It relates to the modification of the work function of the electrodes. Without being limited to the present examples, a specific utilization can be produced in the field of the organic-based thin-film optoelectronic devices such as organic solar cells (OSC), organic light-emitting diodes (OLED) and organic thin-film transistors (TFT), which all have great economic and social benefits. These benefits include the possibility of "printing" very light electronic appliances on flexible substrates with large surface areas at very low cost. In order to inject electrons into or collect electrons from a given organic semiconductor, most of the printed optoelectronic devices require at least one electrode with the sufficiently low work function. Currently, alkaline earth metals (such as Ca, Mg) or other metals coated with alkali elements (such as Li, Cs) comply with this requirement. However, they are chemically very reactive and oxidize easily in the presence of ambient oxygen and water.

In other cases, for example for organic TFTs, electrodes with a very high work function are required for effective injection and/or extraction of electrons (for example with pentacene as organic semiconductor). It is therefore often necessary to utilize costly gold electrodes. A benefit of the present invention lies in the fact that the controlled deposition of non-tetrahedral nanoclusters of silicon and/or germanium on electrodes of a given material allows adjustable modification of the work function of these electrodes; i.e. the inherent work function of the electrodes can be increased or reduced by approximately +/−1.25 eV or +/−1.5 eV by using exactly the same production configuration, by simply adjusting the parameters of the plasma during the growth of the nanoclusters and/or the vertical and horizontal direct-current voltages applied during the deposition of the nanoclusters. Consequently, it becomes possible to replace, for example, the costly gold electrodes with much cheaper copper electrodes, after their functionalization with non-tetrahedral nanoclusters, leading to perfect matching conditions between the metal electrodes utilized and the organic semiconductor. Similarly, by inverting the polarity of the electric field applied during the deposition, an electrode based on material with a low work function, such as Mg, can easily be replaced with a functionalized electrode made from Al.

An example illustrating the importance of utilizing one electrode with a very high work function and another with a very low work function simultaneously in the same appliance relates to solar cells; i.e. photovoltaic devices in general and organic solar cells in particular, since the difference between the work functions of the two electrodes governs the efficiency of the necessary charge separation. As described above, the two electrodes can easily be obtained by functionalization of cheap, non-toxic and stable metal electrodes with the non-tetrahedral nanoclusters of the present invention.

The present invention can also be implemented for optimization of perovskite solar cells (PSC), composed for example of perovskites based on organic-inorganic lead halides as collector of light. Utilization of the dipole moment of the nanoclusters of the present invention considerably improves the charge extraction. Depending on the specific structure of the PSC, the non-tetrahedral nanoclusters can for example be deposited between the metal oxide and the perovskite layer, which considerably improves the photovoltaic performances and the stability of the PSC.

According to the invention, a device is provided comprising a surface on which are deposited non-tetrahedral nanostructures of silicon and/or germanium. Advantageously, according to an embodiment, the non-tetrahedral nanostructures of silicon and/or germanium have respective dipole moments the axes of which are substantially aligned in one and the same direction.

The process according to the invention can be utilized to design an all-silicon or all-germanium memory, in which the dipole orientation of the non-tetrahedral nanostructures is used for coding.

According to the invention, a process is provided for generating a terahertz (THz) emission, in which an oscillating electric field is applied on a substrate comprising on its surface nanoclusters of silicon and/or germanium exhibiting a permanent electric dipole moment.

The terahertz (THz) emission can also be generated by a process in which a short pulse of charges is applied on a substrate comprising on its surface nanoclusters of silicon and/or germanium exhibiting a permanent dipole moment.

The terahertz (THz) emission can also be generated by a process in which a thermal heating is carried out on a substrate comprising on its surface nanoclusters of silicon and/or germanium exhibiting a permanent dipole moment.

Another utilization of the deposited nanoclusters of silicon and/or germanium exhibiting a permanent dipole moment lies in the field of modern telecommunications. Communication in the THz frequency range is conveniently situated between the radio and optical domains and results in extremely high data transfer rates, improved security, less noise or interference with existing frequency channels, such as in the healthcare sector. On account of their specific atomic structure, the nanoclusters of the present invention absorb and efficiently emit a radiation in the THz region; i.e. between 0.1 and 40 THz, and more precisely between 0.5 and 10 THz as a function of their exact structure, their size and their hydrogen content; i.e. as a function of the parameters of the plasma and the chosen conditions of deposition.

On account of the permanent dipole moment of the nanoclusters of the present invention, which persists at least partially even after their deposition on a surface, the THz emission can be generated by the application of an oscillating electric field. Alternatively, it can be triggered by a short pulse of charges applied on the substrate of the nanocluster which will interact transitorily with the over-coordination silicon atoms, bearing a slightly negative charge, so as to trigger an atomic oscillation at a resonance frequency that is specific to the nanocluster. In addition, the THz emission can simply be obtained by thermally heating the nanostructures. The THz radiation emitted by the nanoclusters can be detected by bolometers comprised between 100 GHz and 70 THz.

The direct current (DC) electric field applied during the deposition of nanoclusters also allows the alignment of a large number of nanoclusters emitting in the THz, which leads to the coherent emission of a powerful and very directional THz beam. These properties point to applications that are extremely promising for future appliances in telecommunications, surveillance systems, medical diagnostics and treatment strategies.

Resonant nanostructures are known, such as nanoparticles with a silicon dioxide core and covered with a gold shell, which are envisaged in cancer treatment under the name "AuroShell®". Under actuation by lasers in the near-infra-red domain (which corresponds to frequencies of the order of their resonance frequency), these resonant nanostructures behave as a thermal source capable of destroying cancer cells with which they come into contact (known as "Auro-Lase®" therapy). Although beneficial, these resonant particles have a limited action spectrum and can only be envisaged for the treatment of cancer cells in zones that can be exposed to an infra-red laser, which prevents their application for example for treating tumours of the brain or deep tissues.

Quite unexpectedly, within the framework of the research that led to the present invention, the inventors have now shown that, although strongly bound to the nanocluster, the over-coordination atoms prove extremely mobile around an equilibrium position at the core of the cluster, and can oscillate around this equilibrium position, by which means the nanostructures of the invention can act as mechanical nano-oscillators. Within this framework, the inventors' research allows the assertion that these atoms oscillate at their natural resonance frequency or at another imposed frequency.

Moreover, it is apparent that the resonance frequency of these atoms in a nanostructure according to the invention is situated specifically in the terahertz domain. More precisely, the resonance frequency is typically comprised between 0.001 and 100 THz, most frequently between 0.1 and 20 THz.

In addition, the nanostructures used according to the invention have a permanent dipole moment which, without wishing to be bound in any way to a particular theory, appears to be explained by the fact that over-coordinated atoms are generally slightly eccentric and most commonly negatively charged with respect to their neighbouring atoms. When the atoms occupy their equilibrium position, the value of the permanent dipole moment can be high, and can typically reach values of the order of 4 Debye, the value of this dipole moment varying when the atoms oscillate. Taking account of the existence of this dipole moment, the oscillation of the atoms within a nanostructure according to the invention can also be obtained by applying an external electric field to the nanostructure or an electromagnetic wave. Thus, it is apparent that the nanoclusters of silicon and/or germanium exhibiting a permanent dipole moment of the invention behave as electromechanical nano-oscillators with a natural frequency of the order of the terahertz.

In addition, taking account of their natural frequency of the order of the terahertz, the nanostructures of the present invention can be used to capture or to generate radiations in the terahertz domain, and accordingly constitute an easy source of terahertz radiation, which is known to be difficult to generate.

The inventors' research has also made it possible to demonstrate that when a nanocluster according to the invention is subjected to high-amplitude excitation (electric field or electromagnetic radiation) or to frequencies higher than its resonance frequency, there is forced oscillation of the atoms within the nanostructure, which leads to significant heating of the nanostructure. The amount of heat obtained in this context can be modulated very easily, simply by adjusting the power of the excitation imposed on the nanostructure and the frequency. Thus, by subjecting a nanostructure according to the invention to a low-power radiation having a frequency lower or of the order of its resonance frequency, an oscillation of the atom is obtained at said frequency, while by subjecting the structure to a frequency higher than the resonance frequency and/or having high vibration amplitudes, heating of the nanostructure is obtained, which, in a quite unexpected fashion, can reach very high values, typically being capable of ranging from a few degrees up to 1,000 K. This specific property of the nanostructures of the invention, combined with their high thermal resistance, permits their use by way of nanometric structures capable of delivering a heating effect in a very localized manner. This localized heating effect by the nanostructures of the invention can in particular be used to advantage to carry out the thermal destruction of cancer cells with which the nanostructures have been placed in contact beforehand. In this context the nanostructures of the invention constitute a very interesting alternative to the nanoparticles of the "Auro-Shell®" type mentioned above in the present description. In fact, unlike these nanoparticles, which require actuation by lasers in the near infra-red domain which do not penetrate deep into organic tissues, the nanostructures of the invention are actuated by radiations in the terahertz range, which have the double advantage of penetrating deeply into the tissues and doing so without risk of damage, as these radiation has very low energy. Unlike the "AuroShell®", producing the nanoclusters is much easier, quicker and less costly.

The nanoclusters used in this context can for example be used for the localized treatment of cancer cells. To this end, the nanostructures of the invention are carried in the organism to be treated, and are placed in contact with the cells to be treated, where they are actuated typically by irradiation by an electromagnetic radiation (or alternatively a variable external electric field) having frequencies between 0.01 and 50 THz, these frequencies having the advantage of being capable of passing through all of the tissues. In order to carry the nanostructures close to the cancer cells to be treated, the nanostructures of the invention can be grafted on specific antibodies or proteins of the cells to be treated; see the "nano-furnaces" below. For the treatment of certain tumours, for example of the type found in the case of colon cancer or prostate cancer, the nanostructures can more simply be injected within the organism where they will tend to locate specifically within the tumour zones under the effect known as enhanced permeability and retention (EPR) observed within these tumour zones. To this end, it is possible to use small-size nanostructures deposited on liposomes of a size from 7 to 400 nm. According to a particular embodiment, the nanostructure of the invention can be grafted onto a gene of the ephrin family, which further improves their efficacy for the treatment of tumours, in particular for the treatment of melanomas, leukaemias and cancers of the prostate, lung, oesophagus, cervix, ovary and breast.

The use of nanostructures according to the present invention can be envisaged even for the treatment of brain tumours, for example administered in grafted fashion on a medicament such as ANG1005, which is an antineoplastic agent specially designed to cross the blood/brain barrier.

With respect to the treatment of tumours by the nanostructures according to the invention, it can be carried out by two routes. According to a first embodiment, once they are in contact with the tumour, the nanostructures according to the invention are either brought to temperatures sufficient to cause necrosis of the cancer cells, or brought to temperatures that do not induce necrosis (to a temperature between 37° C. and 80° C., for example between 37° and 50° C., in particular of the order of 42° C.) so as to increase the action of co-administered antineoplastic components.

The injectable pharmaceutical compositions comprising nanoclusters of silicon and/or germanium exhibiting a permanent magnetic and/or electric dipole moment according to the invention for the elimination of cancer cells by the thermotherapy described above constitute a particular subject of the present invention.

According to the invention, the non-tetrahedral nanoclusters can also be incorporated into silicon-based materials, where they allow the material to be thermally processed at a local level. This effect can for example be beneficially used to process silicon-based materials used in the photoelectric devices that are subject to the effect known as Staebler-Wronski effect (degradation effected by exposure to light, causing decline in conversion). The heating produced using the nanostructures according to the invention proves to be sufficient to regenerate the silicon in-situ, without the need to disassemble the device and without risk to the integrity of the surrounding components.

The nanostructures of the invention can furthermore by used by way of terahertz wave emitter. At present, the generation of terahertz waves is obtained by a mixture of frequencies from several infra-red radiation sources, which makes it difficult to implement. The nanostructures of the invention now supply a simple solution for generating a terahertz radiation starting from structures with an extremely small space requirement, which can be integrated in miniaturized devices.

According to a specific embodiment, the nanostructures of the invention can be used to supply a coherent terahertz wave beam, to some extent similar to a "terahertz laser". In this context, the invention supplies in particular an emitter of a beam of coherent terahertz waves, comprising a plurality of nanoclusters of silicon and/or germanium exhibiting a permanent electric dipole moment according to the invention fixed on a support, the axes of the dipole moments of the nanostructures all being substantially aligned in one and the same direction by virtue of the direct-current electric field applied during deposition.

The devices for emission of terahertz waves, coherent or not, implementing the nanostructures according to the invention, can be used for all the known applications of terahertz waves, in particular using their high penetrating power, for example for vision through non-conductive materials (skin, clothing, etc.). According to a more specific embodiment, the devices for generating terahertz waves using nanostructures according to the invention can be implemented to perform the excitation of other nanostructures according to the invention. They can thus, for example, be used as a source of terahertz radiation for the thermotherapy treatments of cancer cells described above in the present description, or for local thermal processing of silicon containing nanostructures according to the invention.

Currently, most of the thin-film data storage media are mainly based on heterogeneous granular CoCrPt alloys, ordered FePt alloys or NiCo-ferrite films. Other applications of magnetic thin layers involve detecting elements as magnetic field sensors, as used for example in anti-lock braking systems (ABS) and electronic stability programs (ESP) in the automobile sector. The thin-film materials used most frequently for these sensors are NiFe or SmCo alloys. In addition, thin layers based on Tb—Co alloy have been used in spintronic devices, such as for example spin valves. Consequently, all the existing magnetic thin films appear to rely on metal alloys, which have the drawback of being costly and possibly toxic.

On account of their electron deficiency, non-tetrahedral nanoclusters of the present invention do not have enough electrons in each Si—Si, Si—Ge or Ge—Ge bond to form spin-up and spin-down electron pairs throughout. Consequently, these nanostructures contain unpaired spin electrons ("unpaired spins"). In fact, the very small movement of the electrons of an atom is sufficient to create a miniscule magnetic field. For non-magnetic materials, the electrons with opposite spins are paired, and consequently, their magnetic fields cancel one another out. On account of their electron deficiency, however, the nanoclusters of the present invention, exactly like the atoms of ferromagnetic elements, have several unpaired electrons which have the same spin, which confers on them a magnetic dipole moment; they can be considered as miniscule magnets. The transitory effect due to the on-state of the electric field after stopping the plasma at the start of deposition, as proposed in the present invention, or even the utilization of a continuous magnetic field during the deposition of the nanoclusters, leads to a spatial alignment of the spins and consequently, to the deposition of all-silicon thin films; i.e. without metal, with magnetic properties. Owing to this alignment of spins, and as in the known magnetic layers, the perpendicular magnetic properties, i.e. in-plane and out-of-plane, show significant differences in the layers originating from the present invention, opening the way to numerous applications.

Consequently, the magnetic thin films without metal, made entirely from silicon or germanium, based on nanoclusters of silicon and/or germanium that have a magnetic dipole moment according to the present invention therefore find applications for example in high-density data storage devices, sensors or spintronic devices analogous to their equivalents made from metal alloys listed above.

According to the invention, a process is provided for depositing a thin film of nanoclusters of silicon and/or germanium, in which process a magnetic or electric field with transitory effect is applied during the deposition so as to align the magnetic dipole moments of these nanostructures and thus form an all-silicon or all-germanium magnetic thin film.

Two types of magnetoresistive devices are proposed in particular. The first type follows the idea of observed magnetoresistance, for example, when the magnetization in a single ferromagnetic film is rotated from an easy axis to a hard axis. The advantage of a magnetic film formed with the nanoclusters of the present invention lies in the fact that the electrons will be "trapped" in circles inside the individual nanoclusters in a plane perpendicular to the magnetic field applied and will not be available for electric transport, which will increase the resistance more dramatically than is observed, for example, for conventional anisotropic magnetoresistance based on metals, which is based only on increased electron diffusion.

The second type follows the idea of giant magnetoresistance (GMR), which is a quantum mechanical magnetoresistance effect observed in multilayers composed of alternating ferromagnetic and non-magnetic conductive layers. Within the framework of the present invention, ferromagnetic layers with well-defined directions of magnetization can be formed during the application of an electric field or a magnetic field (easily implemented in the plasma reactor) during the deposition of the nanoclusters of silicon and/or germanium exhibiting a permanent magnetic and/or electric dipole moment of the present invention. The necessary non-magnetic conductive layers can easily be obtained in the same plasma reactor by temporarily modifying the parameters of the plasma and of deposition, giving doped hydrogenated amorphous silicon thin films. The plasma commutation and the deposition parameters (for example, passing to continuous plasma operation instead of pulsed plasma) allow the deposition of alternating layers necessary for the various applications of GMR, in particular hard drives, biosensors, micro-electromechanical systems (MEMS), and also magnetoresistive random access memories (MRAM); and as before, without the utilization of metal atoms.

To this end, the invention can make provision for producing several layers composed of alternating ferromagnetic and non-magnetic layers with different directions of magnetization, these directions being defined by virtue of the application of the transitory-effect magnetic or electric fields with different directions during deposition of the nanoclusters.

According to the invention, a process is also provided for heating a support in which or on which nanoclusters of silicon and/or germanium exhibiting a permanent dipole moment are arranged, in which process a remote or external alternating electric field is applied.

An application according to the invention can be the design of nano-furnaces for annealing devices or treating diseases.

In fact, the permanent dipole moment of the non-tetrahedral nanostructures of silicon and/or germanium generated can be used to heat these nanostructures in a very controlled manner over a wide temperature range by application of an external alternating electric field. The amplitude and the frequency of this electric field are used to set the desired heating level. By depositing these non-tetrahedral nanostructures for example in the amorphous matrix of a silicon device, application of an external electric field can be used to heat or anneal the silicon device at any subsequent time, in a simple manner. It is known for example that amorphous solar cells rapidly lose their initially high conversion efficiency on account of the Staebler-Wronski effect. This loss of efficiency can be at least partially recovered by annealing the device based on solar cells at temperatures above 150° C.

Another application for nano-furnaces, i.e. the possibility of heating nanoclusters of silicon and/or germanium exhibiting a permanent dipole moment in a very controlled manner is situated in the biomedical field. After having deposited the non-tetrahedral nanostructures of silicon and/or germanium in a liquid, such as for example a physiological solution, the mixture obtained can be injected into the human body; for example directly into a cancerous tumour. It is possible to then apply an external alternating electric field, for example, with the patient's body part containing the tumour to be eliminated placed between the two electrodes. The tumour can be thermally destroyed in a very localized and controlled manner by a suitable choice of the parameters of the electric field (frequency and amplitude) without using toxic or radioactive products. The choice of a precise frequency can also be guided in the interest of exciting the nanoclusters of the present invention as much as possible, and the tissue material surrounding the part of the body to be treated, as little as possible. To this end, excitation at one of the resonance frequencies of the nanoclusters can be chosen.

More precisely, the alternating electric field or any electromagnetic excitation will generally also interact with the dipole moments of the water molecules, displacing them back and forth and stretching and bending the hydrogen bonds, which create heat. The average adult human body is constituted by 50 to 65% water. In order to thus optimize heating of the nanoclusters of the present invention with respect to the water molecules, it is advisable to choose a suitable excitation frequency. To this end, it is known that water molecules do not have time to react to the changes in the electromagnetic field and that no heat is generated if the excitation is carried out at frequencies that are too high (typically above 1,000 GHz). The nanoclusters of the present invention however have resonance frequencies in the THz region (see above): i.e. an excitation frequency range that is effective for the nanoclusters with a minimal response of the omnipresent water molecules is comprised between 0.1 THz and 100 THz, preferably between 1 THz and 20 THz; ideally between 3 and 10 THz.

In other words, in order to excite the nanostructures effectively and to avoid direct excitation of the water molecules, the external alternating electric field can have an excitation frequency comprised between 0.1 THz and 100 THz, preferably between 1 THz and 20 THz; ideally between 3 and 10 THz.

Another effective range of excitation frequencies exists at frequencies that are rather low. To this end, it is known that if the radiation is at frequencies below 1 GHz, the water molecules react to the electromagnetic field, but so slowly that they do not produce heat. Pure water is almost completely transparent to this low-frequency radiation. For the nanoclusters of the present invention, however, heat is generated even at these low frequencies on account of the internal friction being produced between the silicon and/or germanium atoms inside the nanoclusters. The frequencies comprised between 1 Hz and 1 GHz are easily accessible, for example with the electrodes excitation scheme proposed above. Depending on the system of interest, the optimum excitation frequency can thus be found in one of these two frequency ranges. In this way, optimum heating of the nanoclusters, accompanied by minimum heating of the water molecules of the body can be ensured.

In other words, in order to excite the nanostructures of the present invention effectively and to avoid direct excitation of the water molecules as much as possible, the external alternating electric field can have an excitation frequency comprised between 1 Hz and 1 GHz.

For depositing nanoclusters of silicon and/or germanium exhibiting a permanent dipole moment of the present invention in a liquid, the usual solid substrate will be replaced by an open vessel containing an ionic liquid, for example a physiological serum; for example, a saline solution; i.e. a sodium chloride (NaCl) solution. In order to avoid evaporation of this liquid during deposition, the temperature of the gas must be reduced and consequently the on-time of the plasma must be shortened as a result. I.e. a gas temperature of 70° C. and an on-time of the plasma of 50 milliseconds. By way of example, the configuration described in the following document can be used: "Controllable synthesis of silicon nano-particles using a one-step PECVD-ionic liquid strategy", Wei Qin et al. J. Mater. Chem. A, 2015, 3, 10233-10237. For the deposition proposed here of the nanoclusters according to the present invention in a liquid, it is not necessary to align the dipoles of the nanoclusters before deposition. Consequently, the electrodes proposed above, for using direct current (DC) electric fields, are not necessary.

Similarly, the nanoclusters of silicon and/or germanium exhibiting a permanent dipole moment can be attached to well defined antibodies that are capable of binding, for example, to cancer cells or to toxic proteins responsible for a given disease such as for example a given form of dementia. Such proteins are for example the phosphorylated tau protein or the abnormally folded beta-amyloid proteins for Alzheimer's disease. There may also be mentioned the α-synuclein protein associated with Lewy body dementia and Parkinson's disease. Although not limited to this form of binding, the attachment of the nanostructures to the antibodies can be based on the dipolar character of the non-tetrahedral nanostructures of silicon and/or germanium.

As an effective alternative, the nanoclusters of the present invention can be functionalized as described in the article by Zhang Lin et al. (Langmuir 2002, 18, 788-796). To this end, a liquid substrate as above, now containing chemical products for functionalization, can be used.

Alternatively, a layer of sodium salt can be deposited on a standard solid substrate and the nanoclusters are first deposited onto the layer of salt before being functionalized by means of an ammonia plasma. After this process, the substrate and its deposit are removed from the plasma reactor and introduced gently, at a low angle, into a vessel containing a physiological serum. The layer of salt will dissolve in this liquid, leaving the functionalized nanostructures in the liquid, where they can be further functionalized with the antibody.

This nanostructures/antibody assembly can then be injected into the body. Once this assembly is fixed to the target protein, by virtue of the antibodies, the application of an alternating external electric field heats the nanostructures and consequently, the attached target proteins by thermal conduction. The frequency and amplitude of the field can be varied in order to carefully attain the necessary heating level, either to simply disintegrate the harmful protein/peptide aggregates, or to completely destroy the target toxic proteins.

BRIEF DESCRIPTION OF THE DRAWINGS

Other characteristics and advantages of the invention will become apparent on reading the detailed description of implementations and embodiments that are in no way limitative, in light of the attached figures in which.

DETAILED DESCRIPTION

The embodiments which will be described hereinafter are in no way limitative; it is possible in particular to implement variants of the invention comprising only a selection of characteristics described hereinafter in isolation from the other features described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described are intended to be combined together in all combinations where there is no objection thereto from a technical point of view.

In the figures, the elements common to several figures retain the same reference.

The purpose of the present invention is to modify the work function of a material. It was noted that the non-tetrahedral nanostructures, nanoclusters or quantum dots of silicon and/or germanium constituted an excellent candidate. To this end, a device and a mode of operation were defined to generate such elements, and provision was made to deposit them in the form of thin layers on the surface of the substrate of a given material.

It is known that a dipole surface layer modifies the work function of the material on which this layer is deposited. The present invention goes further, as it makes it possible to control precisely the work function modification value (in particular by controlling the thickness and the constitution of the layer, and the orientation of the nanostructures in the layer), and to vary the work function of the material along the surface on which the layer of nanostructures is placed. Furthermore, these nanostructures are non-toxic and inexpensive as they are produced starting from inexpensive materials such as silicon for example, and can be generated in a plasma-enhanced chemical vapour deposition reactor.

Figure 1:
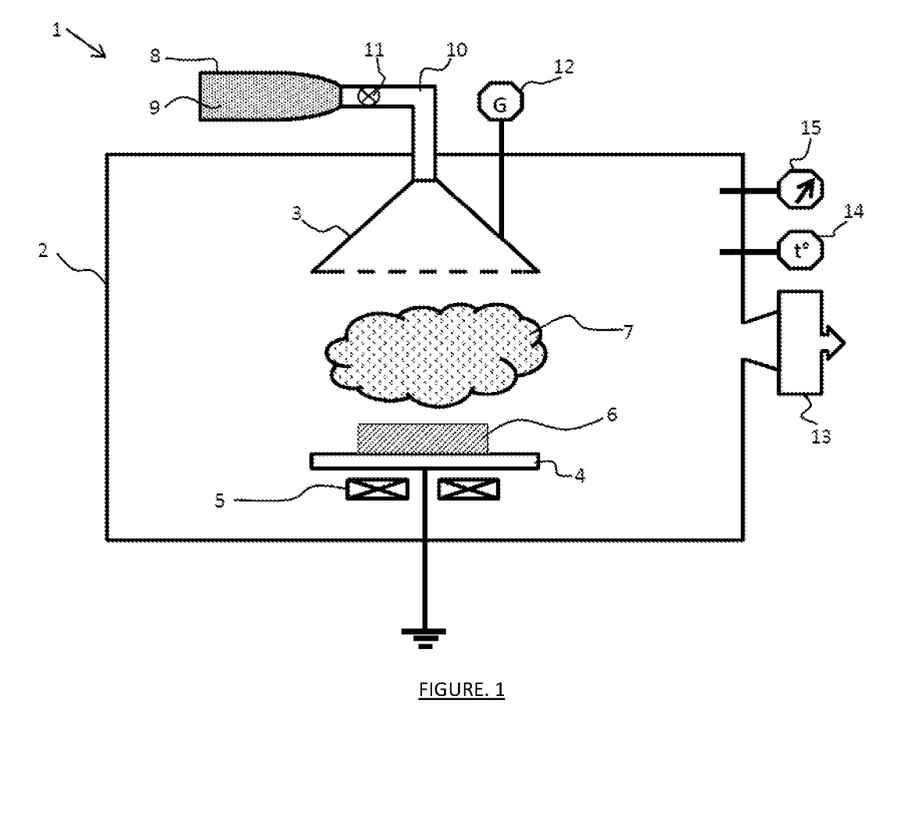
FIG. 1 is a diagrammatic view of a plasma-enhanced chemical vapour deposition reactor for deposition of non-tetrahedral nanostructures of silicon and/or germanium on a material, for example a lanthanum hexaboride ($LaB_6$) substrate.

FIG. 1 shows very diagrammatically a reactor 1 comprising an enclosure 2 in which are arranged a first electrode 3 and a second electrode 4 connected to ground. Heating elements 5 are provided to maintain a desired temperature. The substrate of a given material 6 on which a layer of nanostructures is intended to be deposited is arranged on the second electrode 4. Provision is made to generate between the two electrodes 3 and 4, a plasma 7 of nanoclusters of silicon and/or germanium exhibiting a permanent magnetic and/or electric dipole moment which will be deposited on the surface of the material 6 facing the first electrode 3.

In order to create this plasma 7, a recipient 8 containing a gaseous mixture 9, for example, of silane and/or germane and argon is connected to the first electrode 3 via an injection pipe 10. A valve 11 is provided in the pipe 10 to control the injection and the injection flow. The electrode 3 has, for example, the shape of a shower head and contains a pierced inner face to allow the gaseous mixture 9 to pass through to the plasma generation zone between the two electrodes.

A radiofrequency generator 12 is also shown, capable of generating a radiofrequency discharge signal during the injection of the gaseous mixture so as to create the plasma 7.

A pump 13 is connected to the enclosure 2 to evacuate the gaseous content of the enclosure and adjust the desired pressure level in the enclosure 2.

A temperature sensor 14 and a pressure sensor 15 make it possible to measure the temperature and pressure respectively within the enclosure 2.

In operation, as a typical but non-limitative example, a primary vacuum is firstly formed in the enclosure 2 having a volume of approximately 0.02 $m^3$. Then, a radiofrequency discharge of 13.56 MHz is applied at low pressure between the two electrodes 3 and 4. The surfaces of the electrodes are circular and have a diameter of 7 cm. The inter-electrode distance is 4 cm. The first electrode 3 has, for example, the shape of a shower head allowing the injection of the gaseous mixture 9 of silane and/or germane diluted in a neutral gas (for example, argon or/and helium) to which hydrogen can be added in order to produce nanostructures according to the invention. The flow of the gaseous mixture 9 is 10 $cm^3$/min. The pump 13, connected to the enclosure 2 by an electronically-controlled butterfly valve (not shown), is used to continuously extract the gaseous mixture from the enclosure and to maintain a constant low pressure of 0.12 mbar in the reactor. Under these conditions, the time required for completely eliminating the residual nanostructures around the material, between the electrodes, after a radiofrequency discharge pulse is estimated at 1.5 second. This time period determines the typical time interval of 6 seconds between two trigger pulses of the plasma discharge during deposition of the nanostructures.

During the injection, the gaseous mixture is typically heated at 150° C. The enclosure is also brought to the same temperature of 150° C. At such a gas temperature, the formation of "first generation" nanoparticles, which take approximately 6 seconds before starting to agglomerate, is guaranteed. Advantageously, the discharge time (time period during which the plasma is generated) is set at 2 seconds, much less than said 6 seconds, so as to allow in this way the creation of nanostructures having dimensions according to the invention and to avoid the formation of agglomerated particles.

In other words, as soon as the plasma is switched on, dissociation of the silane molecules ($SiH_4$) leads to the formation of $SiH_3$, recognized as the main core starting from which the formation of silicon nanoparticles begins in low-pressure non-thermal plasmas. The electrical properties of the plasma and of the discharge are utilized to monitor the different phases of growth. The agglomeration phase is not reached, so that only the individual nanostructures are deposited on the material.

In order to carry out the deposition, the plasma is generated in pulsed fashion by controlling the instant of creation and end of creation of the plasma. According to the invention, several milliseconds after stopping the plasma, a continuous electric field is generated between the two electrodes so as to impose an orientation on the nanostructures before they are placed on the substrate material. The work function of the substrate material on which a layer of nanostructures has been deposited has an increase or a reduction in the work function according to the orientation of the DC electric field. The orientation of the nanostructures during their deposition on the surface of the material thus makes it possible to precisely adjust the value of the work function, which will be lower or higher than the work function of the material before the deposition.

Figure 2:
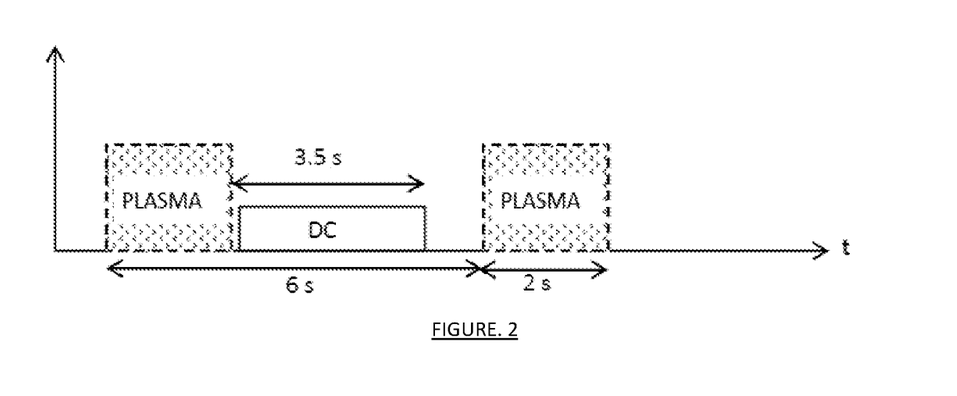
FIG. 2 is a graphic representation illustrating a typical cycle of deposition of nanostructures.

FIG. 2 represents a typical example of some command signals of the process of deposition. Each deposition cycle starts with the generation 16 of the plasma during a well determined time period. Then a waiting time period comprised between 1 and 200 ms is complied with before generating, following the signal 17 in FIG. 2, a direct-current voltage between the two electrodes 3 and 4 so as to modify the orientation of the nanostructures that are deposited on the surface of the material. In the typical but non-limitative example, the next cycle starts 6 seconds after the beginning of the first cycle, which leaves approximately 1.5 second for evacuation of the residual nanostructures of the first generation in the enclosure.

According to the invention, the direct-current voltage applied makes it possible to modify the orientation of the nanostructures on the surface of the material. This direct-current voltage can advantageously be adjusted, after extension of the plasma and during deposition of the nanostructures. The adjustment can be continuous or in stages. It is possible to refine the adjustment of the work function. It can then be envisaged to create different work function levels along the surface of the material. It is possible in particular to envisage implementing a voltage gradient, i.e. different direct-current voltage values along the surface of the material. To this end, in FIG. 3 it is envisaged to arrange several sub-electrodes 18, 19, 20 and 21 (which can originate from subdivision of the first electrode), each fed with a different voltage such as for example respectively 0 V, 30 V, 60 V and 90 V. The level of direct-current voltage for each sub-electrode is a function of the desired work function level in the part of the material facing the sub-electrode in question.

Figure 3:
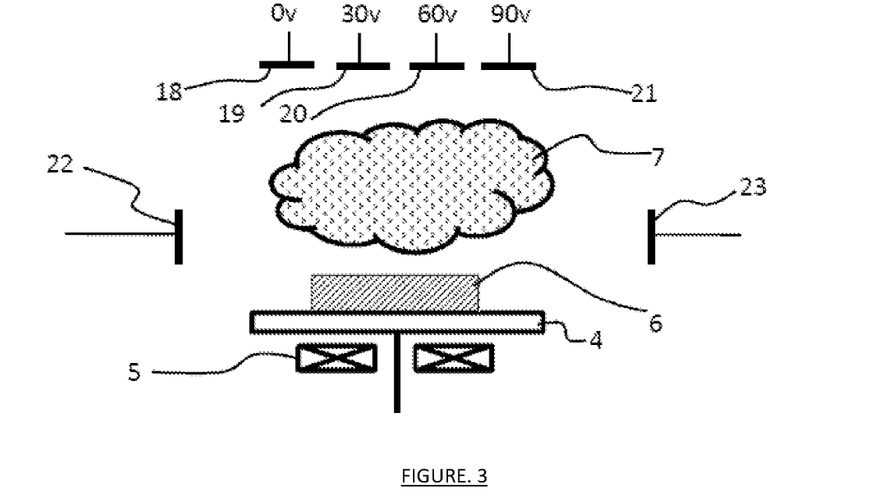
FIG. 3 is a diagrammatic view of a configuration of electrodes for applying several direct-current voltages of equal or different values, after extension of the plasma and during the deposition of the nanostructures on the material.

These direct-current voltage values can be progressive, so as to define a continuous gradient, stages of values, or not progressive, so as to define any variation whatever in the form of the work function along the material. According to the invention, provision is also made to apply at least two direct-current voltages that are for example oriented orthogonally so as to have a finer control over the orientation of nanostructures during their deposition. One can be applied vertically between the two electrodes 3 and 4, the other can be applied horizontally between the electrodes 22 and 23. The direct-current voltages applied are preferably comprised between 0 V and 1,000 V; preferably approximately 200 V.

Figure 4:
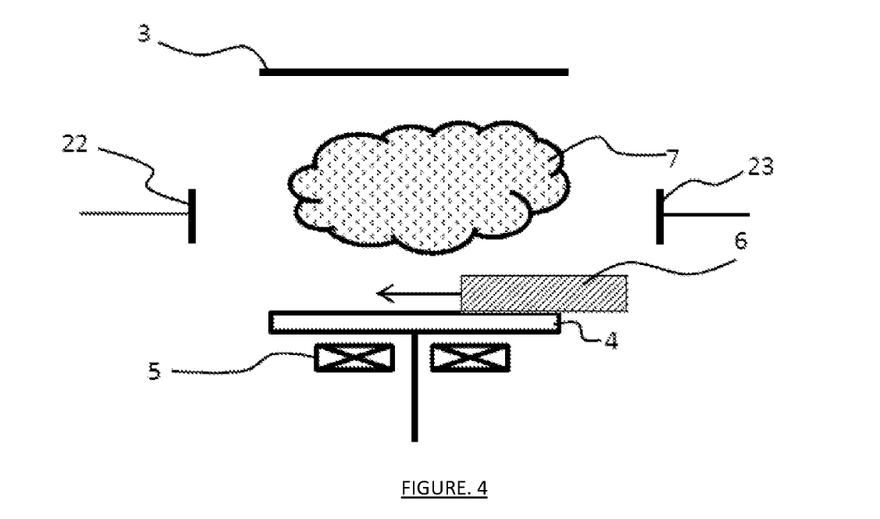
FIG. 4 is a diagrammatic view illustrating the displacement of the material during the deposition.

In FIG. 4 according to the invention, provision is made to displace the material with respect to at least the first electrode during deposition. This configuration makes it possible in particular to be able to modify the layer thickness and thus, the work function, on different parts of the material. In this configuration, either the electrode is fixed and the material is displaced, or vice-versa. The electrode used to apply the direct-current voltage is advantageously the first electrode 3 utilized to apply the discharge after switching off the plasma, but this can be another electrode.

The present invention relates to the production and deposition of one or more layers of nanoclusters of silicon and/or germanium exhibiting a permanent magnetic and/or electric dipole moment at the surface or in the matrix of a given material or in a liquid. The objective being to reduce or increase the work function of this material according to the requirements of the application in question, so as to improve the performance and/or reduce the costs. The materials can be presented in the form of mass (3D), thin layer (2D), nanowire (1D), or nanoparticle (0D). The applications in question include, non-limitatively, thermionic emission, thermoelectric devices, band bending in micro- and nano-electronics, new all-silicon memories, due to magnetic properties of these nanostructures; telecommunications based on terahertz devices; nano-furnaces for annealing devices or for the treatment of cancer or other diseases such as Alzheimer's disease; organic electronics; photoelectric devices; catalytic reactions and fractionation of water. Furthermore, the layer of non-tetrahedral nanostructures of silicon and/or germanium prevents the evaporation of the atoms of volatile materials and thus protects the material against any chemical degradation, such as for example oxidation. Moreover, the deposition of non-tetrahedral nanostructures of silicon and/or germanium can have environmental advantages when it is utilized for the modification of the work function of toxic materials.

Of course, the invention is not limited to the examples that have just been described, and numerous adjustments may be made to these examples without departing from the scope of the invention.

The invention claimed is:

1. A process for producing and depositing nanoclusters of silicon and/or germanium exhibiting a permanent magnetic and/or electric dipole moment by means of a capacitive- or inductive-coupling plasma reactor by implementing a pulsed plasma-enhanced chemical vapour deposition (PECVD), microwave plasma chemical vapour deposition, cathodic or magnetron sputtering; the process being carried out with the following parameters:

a pressure comprised between 0.05 mbar and 5 mbar;
a radiofrequency discharge at 13.56 MHz or their harmonics, or microwave discharge at 2.45 GHz or their harmonics for creation of a plasma;
a driving power comprised between 0.1 mW/cm$^3$ and 5 mW/cm$^3$;
a gas temperature between 50° C. and 150° C.;
a time period between the start of generation and the end of generation of a plasma in the reactor comprised between 0.1 second and 10 seconds; and
the nanoclusters are deposited and oriented under the effect of a DC electrical voltage comprised between 0 V and 1,000 V.

2. The process according to claim 1, characterized in that it comprises depositing nanoclusters on a material; parameters being defined so as to adjust the work function of this material.

3. The process according to claim 1, characterized in that the nanoclusters have a size less than or equal to 4 nm.

4. The process according to claim 2, characterized in that the plasma is generated during a specific time period that determines the level of adjustment of the work function of the material.

5. The process according to claim 1, characterized in that production of the nanoclusters of silicon and/or germanium is obtained starting from a gaseous mixture based on silane and/or germane, mixed with argon, helium and/or hydrogen, or starting from a gaseous mixture based on tetrafluorosilane.

6. The process according to claim 1, characterized in that the nanoclusters are deposited on a material in at least one homogeneous layer or leaving a part of the surface of the material uncovered.

7. The process according to claim 1, characterized in that during a plasma deposition on a material in a reactor, the process comprises the steps of:

generating a plasma;
stopping the plasma at the end of said time period, allowing the creation and preservation of the nanoclusters of silicon and/or germanium exhibiting a permanent magnetic and/or electric dipole moment; and
applying at least one direct-current voltage so as to modify the orientation of the nanostructures being deposited on the material so as to adjust the work function of the material to be treated.

8. The process according to claim 7, characterized in that the adjustment consists of:

applying a direct-current voltage; and
varying this direct-current voltage in space or time, so as to obtain a variation of the work function along the material.

9. The process according to claim 7, characterized in that the adjustment consists of applying in the reactor at least two direct-current voltages, the directions of which are orthogonal.

10. The process according to claim 9, characterized in that it comprises a step of varying in space or time at least one of these two voltages so as to obtain a variation of the work function along the material.

11. The process according to claim 7, characterized in that the time period between stopping the generation of the plasma and application of a direct-current voltage is comprised between 1 ms and 2,000 ms.

12. The process according to claim 1, characterized in that it comprises the creation of several individual layers.

13. The process according to claim 12, characterized in that during pulsed plasma-enhanced chemical vapour deposition (PECVD) in a reactor, the time period between two pulses is greater than or equal to the time necessary to empty the reactor.

14. The process according to claim 1, characterized in that the deposition step comprises a first phase of deposition of the nanoclusters on a transporter element comprising a sol-gel, a liquid, or a sol-gel liquid matrix; and a second phase of deposition on a material.

15. The process according to claim 1, characterized in that the deposition is carried out on a metal or a metal oxide forming cathodes or electrodes in a thermionic device, a thermoelectric device or an electron emission device.

16. The process according to claim 1, characterized in that the deposition is carried out on a catalytic material intended to be utilized as catalyst during a chemical reaction.

17. The process according to claim 1, characterized in that it comprises depositing an all-silicon or all-germanium magnetic thin film by applying a magnetic or electric field with transitory effect during the deposition so as to align the magnetic dipole moments of the nanoclusters.

18. The process according to claim 17, characterized in that several layers composed of alternating ferromagnetic and non-magnetic layers are produced with different directions of magnetization, these directions being defined by virtue of the application of the transitory-effect magnetic or electric fields with different directions during deposition of the nanoclusters.

* * * * *